(12) United States Patent
Peng et al.

(10) Patent No.: US 7,190,591 B2
(45) Date of Patent: Mar. 13, 2007

(54) HEAT SINK ASSEMBLY

(75) Inventors: Xue-Wen Peng, Shenzhen (CN); Bing Chen, Shenzhen (CN)

(73) Assignees: Fu Zhun Precision Industry (Shen Zhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 32 days.

(21) Appl. No.: 11/209,928

(22) Filed: Aug. 23, 2005

(65) Prior Publication Data

US 2006/0087817 A1   Apr. 27, 2006

(30) Foreign Application Priority Data

Oct. 21, 2004   (CN) .................. 2004 2 0094351

(51) Int. Cl.
 H05K 7/20   (2006.01)
 A44B 21/00   (2006.01)
 A47B 97/00   (2006.01)

(52) U.S. Cl. .................. 361/719; 24/458; 248/510; 361/704; 361/710

(58) Field of Classification Search ........ 257/718–719; 361/719
 See application file for complete search history.

(56) References Cited

U.S. PATENT DOCUMENTS 5,982,622 A * 11/1999 Chiou .................. 361/704
6,097,601 A * 8/2000 Lee .................. 361/704
6,141,220 A * 10/2000 Lin .................. 361/704
6,307,747 B1 * 10/2001 Farnsworth et al. ........ 361/704
6,724,632 B2   4/2004 Lee et al.
6,775,138 B2   8/2004 Lee et al.
6,778,396 B2 * 8/2004 Liu .................. 361/719
7,126,824 B2 * 10/2006 Lee et al. .................. 361/704

* cited by examiner

*Primary Examiner*—Greg Thompson
(74) *Attorney, Agent, or Firm*—Morris Manning & Martin LLP; Tim Tingkang Xia, Esq.

(57) ABSTRACT

A heat sink assembly includes a heat sink (10) deposited on a circuit board (100), a pair of bolts (30), and a clip (20) attached to the circuit board. The clip includes a pressing portion (22) engaging the circuit board, a first locking portion (26) and a second locking portion (28). The first locking portion defines an opening (42) and a slot (40) and the second locking portion defines a positioning groove (50). The clip further includes a clamping portion (70) linearly movably and rotatable mounted on the second locking portion. One bolt has a head engaging with the heat sink and a bead engaging with the first locking portion. The other bolt has a head engaging with the heat sink and a bead engaging with the clamping portion.

18 Claims, 5 Drawing Sheets

HEAT SINK ASSEMBLY

BACKGROUND

1. Field

The present invention generally relates to a heat sink assembly, and particularly relates to a heat sink assembly with a clip which can be adjusted to mount heat sinks having different sizes to different printed circuit boards.

2. Related Art

Development of integrated circuit technology has resulted in the density of very large scale integrated circuits (VLSI) in electronic element package. The electronic element package operates at a very high speed and thereby generates a great amount of heat. Therefore, how to dissipate the heat quickly and effectively has become an issue.

In order to remove the heat generated by the electronic element package, a heat sink is applied to assist dissipating heat, and a clip is used to fasten the heat sink to the electronic element package tightly. The earliest method of securing a heat sink is to use several screws extending through a printed circuit board (PCB) and the heat sink to couple the heat sink to the electronic element package installed on the PCB. However, it is distinctly inconvenient to mount or remove the heat sink.

A wire clip has been consequently applied. A wire clip is generally made by bending a metal wire to form an elastic Z-shaped clip with a middle press portion and two clamping arms extending from the press portion. In use, the press portion of the wire clip bears against the heat sink and the clamping arms clamp protrusions of a socket connector on the PCB. However, it is inconvenient to hold the slim clip in use. So, it is not widely used.

Additionally, most of traditional clips including the foregoing wire clip, have a common problem that clamping portions of the clips are not adjustable. That is to say, the distance between the clamping portions is constant. As a result, one clip cannot be universally used in more than one heat sink having different sizes. If the dimensions of the heat sinks are varied, new clips having different sizes must be provided accordingly. Thus, a variety of specific clips must be manufactured in light of the specifications of the heat sinks to meet requirements of mounting multifarious heat sinks onto the PCBs.

SUMMARY

What is needed is a heat sink assembly having an adjustable clip which can mount different heat sinks having different sizes to printed circuit boards.

A heat sink assembly in accordance with a preferred embodiment of the present invention comprises a heat sink deposited on a top of a circuit board, a pair of bolts extending through the heat sink and the circuit board, and a clip attached to a bottom of the circuit board. The clip comprises a pressing portion pressing against the bottom of the circuit board, a first locking portion and a second locking portion extending from opposite ends of the pressing portion. The first locking portion defines an opening and a slot communicated with the opening. The second locking portion defines a positioning groove. The clip further comprises a clamping portion and a connecting portion movably connecting the clamping portion and the second locking portion together by an engagement of the connecting portion within the positioning groove. The clamping portion is also rotatable relative to the second locking portion and is able be to tightly sandwich between a bottom bead of one of the bolts and the second locking portion.

Other advantages and novel features of the invention will become more apparent from the following detailed description when taken in conjunction with the accompanying drawings, in which:

DETAILED DESCRIPTION OF THE EMBODIMENTS

Reference will now be made to the drawings to describe embodiments of the present invention in detail.

Figure 1:
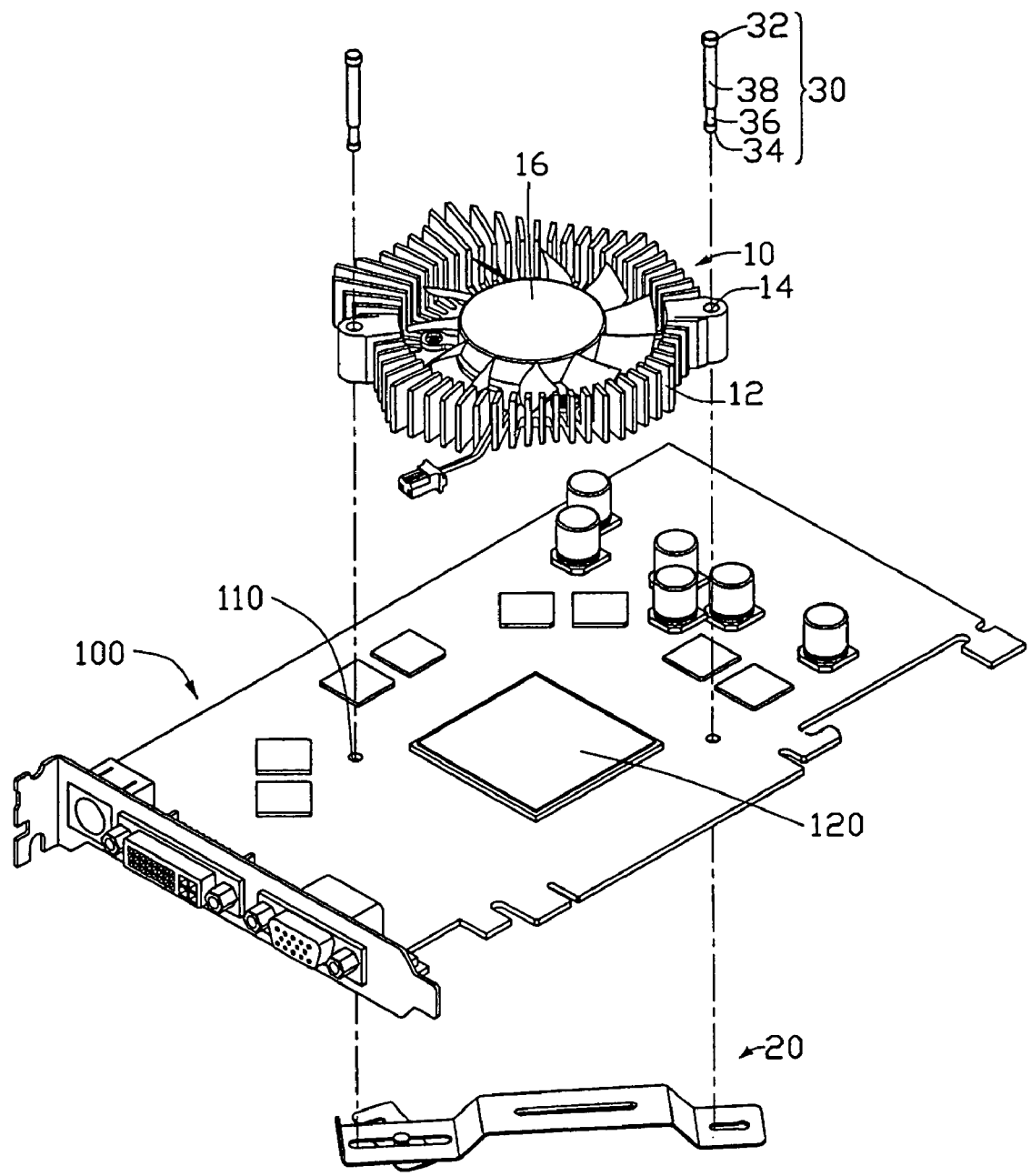
FIG. 1 is an exploded, isometric view of a heat sink assembly in accordance with a preferred embodiment of the present invention comprising a heat sink, two bolts and a clip coupling with the bolts for securing the heat sink to a circuit board.

FIG. 1 illustrates a heat sink assembly in accordance with a preferred embodiment of the present invention, together with a first member such as a circuit board 100 having a chipset 120 mounted on a top thereof. The circuit board 100 defines a pair of through apertures 110 therein, near a pair of diagonal corners of the chipset 120.

The heat sink assembly comprises a second member such as a heat sink 10, a clip 20 attached to a bottom of the circuit board 100 and a pair of mounting elements, such as bolts 30 cooperating with the clip 20 to mount the heat sink 10 onto the circuit board 100.

The heat sink 10 comprises a plurality of cooling fins 12 arranged radially and defines a central space accommodating a fan 16 therein. The heat sink 10 further defines a pair of holes 14 corresponding to the through apertures 110 respectively. Each bolt 30 comprises a head 32 at a top end thereof, a post 38, a narrow neck 36 below the post 38 and a bead 34 at a bottom end thereof.

Figure 2:
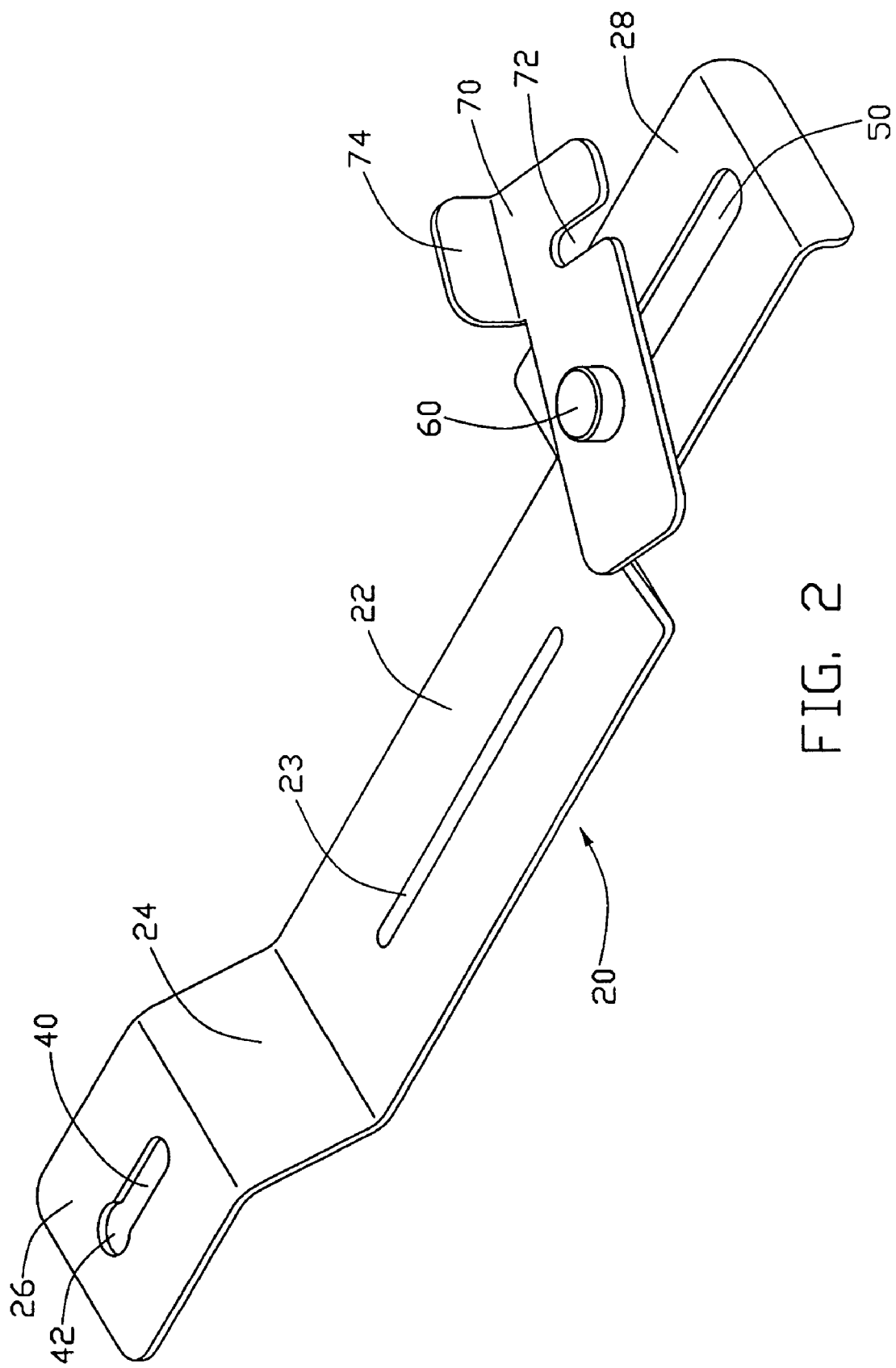
FIG. 2 is an enlarged bottom view of the clip of the heat sink assembly of FIG. 1.

Referring also to FIG. 2, the clip 20 comprises a pressing portion 22 defining a slit 23 therein, a pair of inclined portions 24 extending from opposite ends of the pressing portion 22 respectively, a first locking portion 26 extending from a free end of one of the inclined portions 24 and a second locking portion 28 extending from a free end of the other inclined portion 24. The first and second locking portions 26, 28 are respectively parallel to the pressing portion 22. The first locking portion 26 defines a slot 40 therein and an opening 42 communicated with the slot 40. The opening 42 is located distant from the pressing portion 22. The slot 40 has a width which is larger than a diameter of the narrow neck 36 and smaller than a diameter of the bead 34 of the bolt 30. The opening 42 has a diameter which is larger than that of the bead 34. The second locking portion 28 defines a positioning groove 50 which has a width larger than the diameter of the bead 34. The clip 20 further comprises a clamping portion 70 and a connecting portion such as a rivet 60. The rivet 60 connects the clamping portion 70 and the second locking portion 28 together in such a manner that the claming portion 70 is linearly movable and rotatable relative to the second locking portion 28. The linear movement of the clamping portion 70 is along the positioning groove 50. The rivet 60 has a portion extending through the positioning groove 50. The clamping portion 70 defines a cutout 72 at a side thereof and a handle 74 at another side thereof opposite the cutout 72. The cutout 72 has a width larger than the diameter of the narrow neck 36 and smaller than the diameter of the bead 34.

Figure 3:
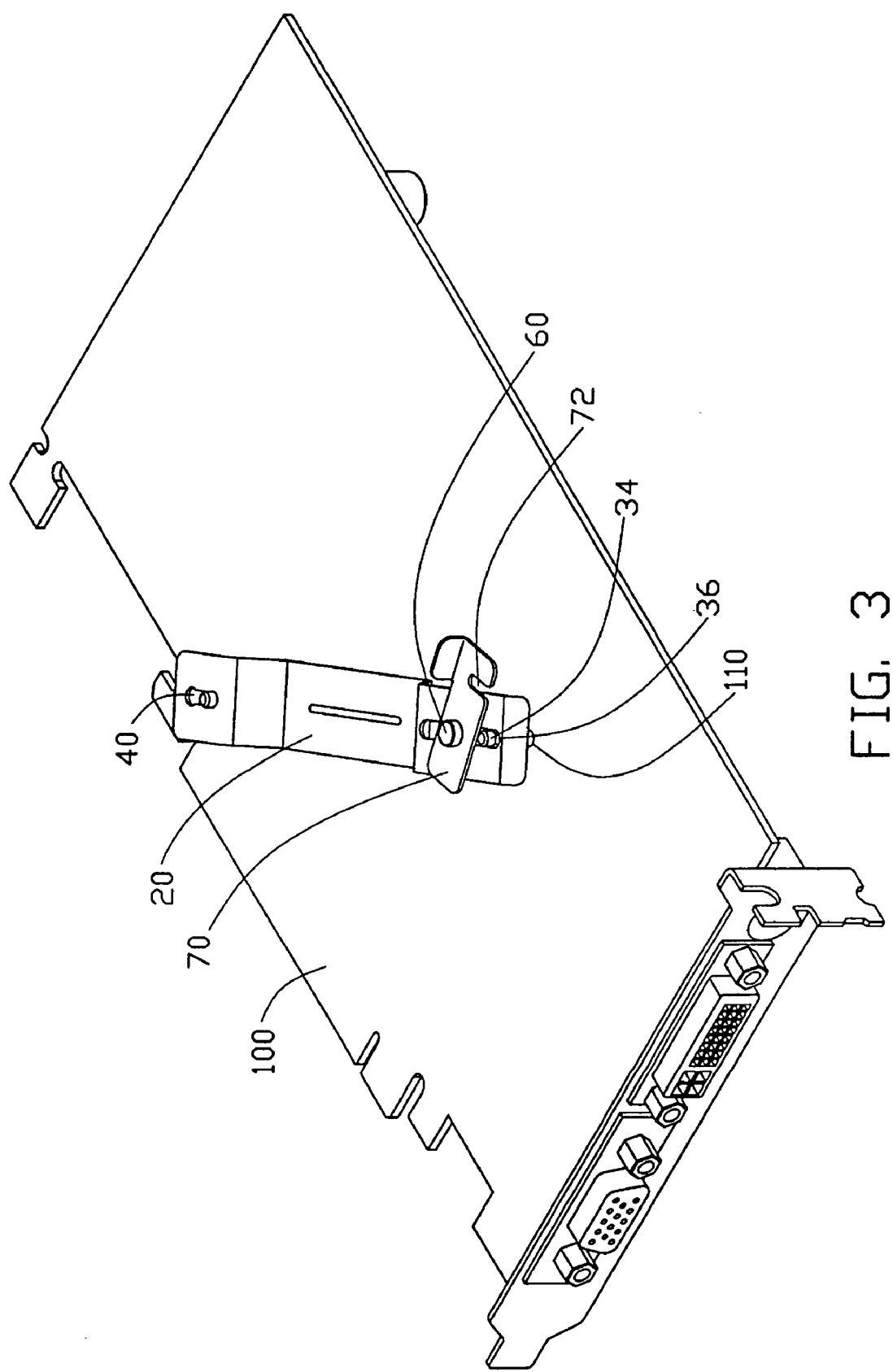
FIG. 3 is a bottom assembled view of the heat sink assembly and the circuit board of FIG. 1.
Figure 4:
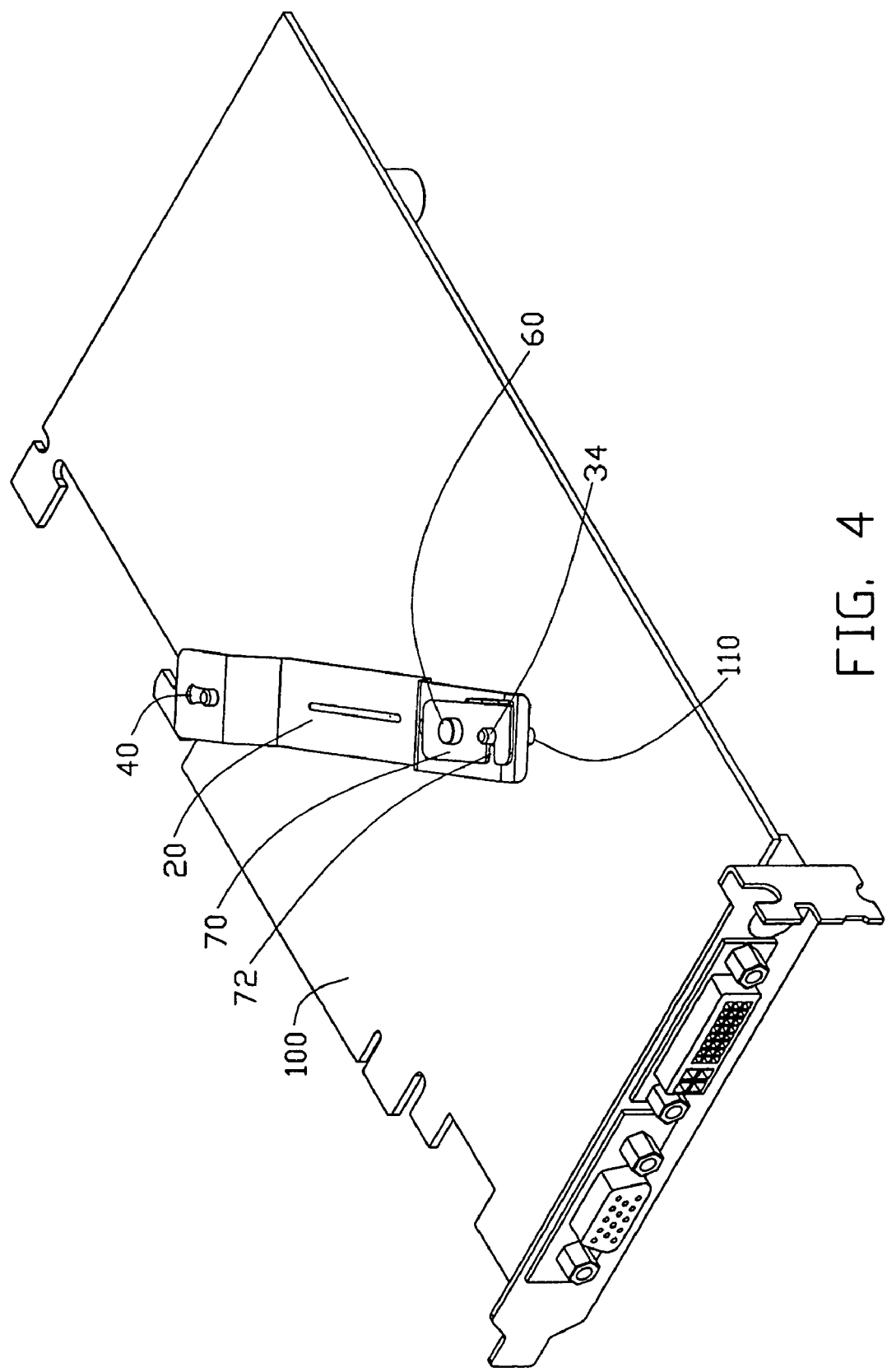
FIG. 4 is a view similar to FIG. 3, but the clip is moved to a lock position.

In assembly, referring also to FIGS. 3–4, the bolts 30 respectively extend through the holes 14 of the heat sink 10 and the through apertures 110. The head 32 of each bolt 30 abuts against the heat sink 10. The beads 34 of the bolts 30 correspondingly pass through the opening 42 of the first locking portion 26 and the groove 50 of the second locking portion 28, respectively, until the narrow necks 36 of the bolts 30 positioned in the opening 42 and the groove 50, respectively. The clip 20 is moved so that the narrow neck 36 positioned in the opening 42 is received in the slot 40 and abuts against the first locking portion 26 at an edge of the slot 40 distant from the opening 42. The narrow neck 36 positioned in the groove 50 is moved in the groove 50. The groove 50 is much longer than the slot 40. The first locking portion 26 is thus urged by the bead 34 of the corresponding bolt 30 toward the bottom of the circuit board 100. The clamping portion 70 is moved and then rotated so that the narrow neck 36 of the bolt 30 in the groove 50 is fittingly received in the cutout 72 (shown in FIG. 4). The clamping portion 70 is thus tightly sandwiched between the bead 34 and the second locking portion 28, whereby the second locking portion 28 is urged toward the bottom of the circuit board 100. The pressing portion 22 thus pressingly abuts against the bottom of the circuit bard 100 due to action of spring force produced by the clip 20. Therefore, the heat sink 10 is pressed downwardly by the bolts 30 to have an intimate engagement with the chipset 120.

In this embodiment, the connecting portion 60 is capable of sliding in the positioning groove 50 and the clamping portion 70 is rotatable on the second locking portion 28. Therefore, a distance from the cutout 72 to the slot 40 is adjustable. Consequently, the clip 20 may be applied to different circuit boards 100 with different distances of the holes 110 to have variously dimensioned heat sinks mounted thereon respectively.

Figure 5:
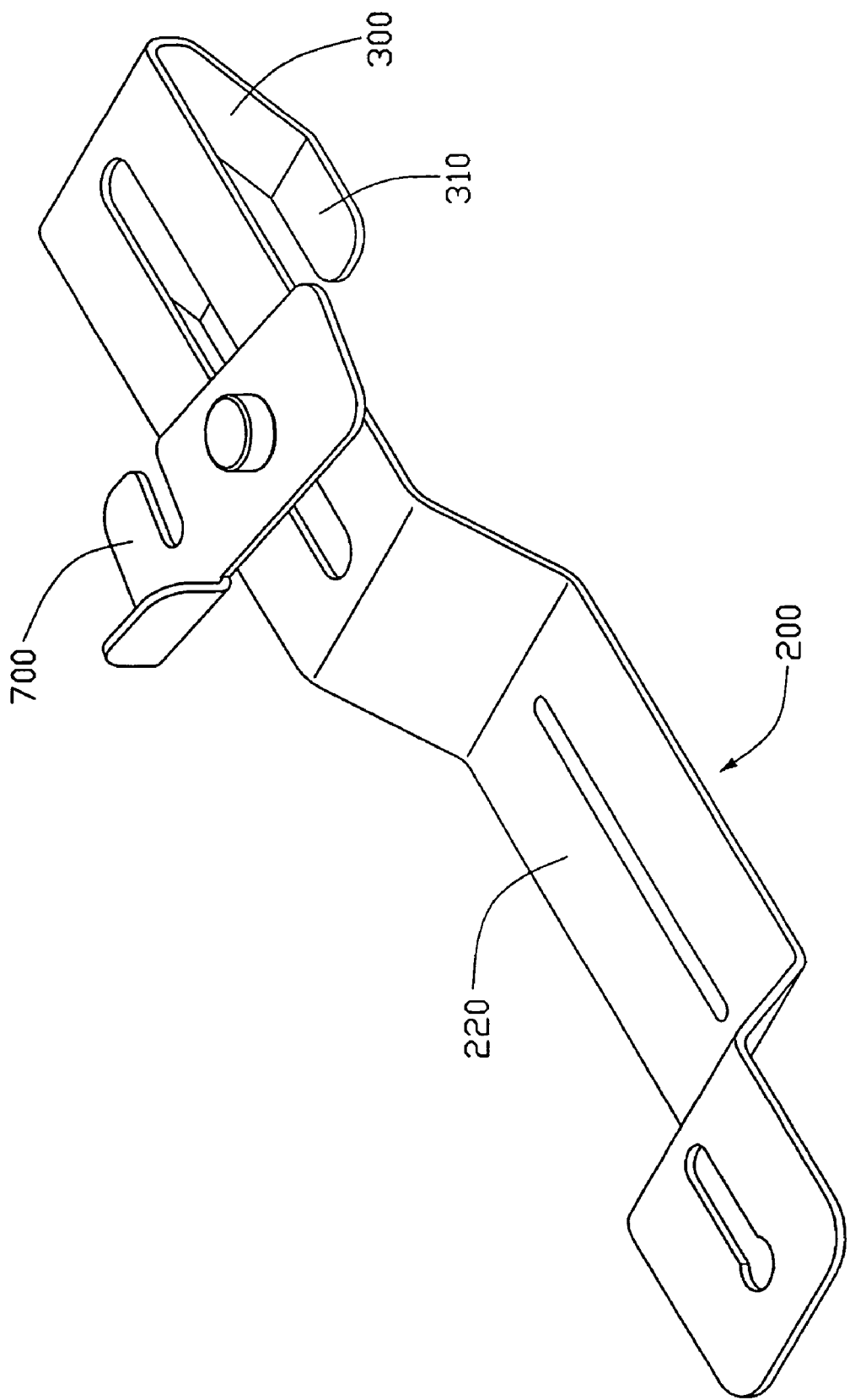
FIG. 5 is an isometric view of an alternative clip suitable for securing the heat sink to the circuit board of FIG. 1.

Referring also to FIG. 5, it shows an alternative clip 200 in accordance with the present invention; this alternative clip 200 is particularly suitable for a circuit board having the two holes 110 with a large distance therebetween. The clip 200 is substantially the same as the clip 20, except that a spring portion 300 extends from an end of the clip 200. The spring portion 300 extends from the second locking portion to a position above the second locking portion. A distal part 310 of the spring portion 300 is formed to be located on a same plane as the pressing portion 220. When the clip 200 is mounted to the circuit board 100, the distal part 310 and the pressing portion 220 abut against the bottom of the circuit board 100. In operation, the pressing portion 220 and the distal part 310 at the same time press against the circuit board 100. This structure facilitates to evenly distribute force exerted by the clip 200 on the circuit board 100 when the distance between the holes 110 of the circuit board 100 is large. The clip 200 has a clamping portion 700 which is linearly movably and rotatable mounted on the second locking portion.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat sink assembly placing onto a circuit board comprising:
    a heat sink deposited on one side of the circuit board;
    a clip attached to the other side of the circuit board, the clip comprising:
        a pressing portion pressing against the circuit board;
        first and second locking portions respectively extending from opposite ends of the pressing portion, the second locking portion defining a positioning groove;
        a connecting portion movably inserted in the positioning groove; a clamping portion defining a cutout therein, the clamping portion connected with the second locking portion via the connecting portion; and
    a pair of mounting elements extending through the heat sink and the circuit board;
    wherein one of the mounting elements engages with the heat sink and the first locking portion, and wherein the other one of the mounting elements engages with the heat sink and extends through the positioning groove and the cutout of the clamping portion and engages with the clamping portion.

2. The heat sink assembly as claimed in claim 1, wherein the connecting portion connects the clamping portion with the second locking portion by engagement of the connecting portion within the positioning groove.

3. The heat sink assembly as claimed in claim 1, wherein the mounting elements comprise a pair of bolts, each bolt having a narrow neck and a bead respectively extending through the first locking portion and the positioning groove of the second locking portion.

4. The heat sink assembly as claimed in claim 3, wherein the first locking portion defines a slot and an opening communicated with the slot, the narrow neck of one of the bolts being sliding from the opening to the slot.

5. The heat sink assembly as claimed in claim 4, wherein the slot has a width which is smaller less than a diameter of the opening.

6. The heat sink assembly as claimed in claim 1, wherein the clip further comprises a pair of inclined portions connecting the pressing portion and the first and second locking portions.

7. The heat sink assembly as claimed in claim 1, wherein the clip further comprises a spring portion extending from a free end of the second locking portion, the spring portion comprising a distal part pressing against the circuit board.

8. A heat sink assembly comprising:
    a first member carrying an electronic component thereon;
    a second member attached to the electronic component for absorbing heat generated by the electronic component;
    a pair of mounting elements extending through the first member and the second member; and
    a clip resiliently engaging the first member and removable on the first member along a direction parallel to the first member, the clip comprising:
        first and second locking portions respectively at opposite ends of the clip and engaging with the mounting elements to mount the second member on the first member;

a clamping portion connected with and movable relative to the second locking portion, the clamping portion defining a cutout at a lateral side thereof, the cutout fittingly receiving one of the mounting elements therein.

9. The heat sink assembly as claimed in claim 8, wherein the first member is a circuit board defining a pair of through apertures adjacent to diagonal corners of the electronic component and the second member is a heat sink defining a pair of holes corresponding to the through apertures.

10. The heat sink assembly as claimed in claim 9, wherein the clip further comprises a pressing portion pressing against the circuit board, the first and second locking portions respectively extending from opposite ends of the pressing portion.

11. The heat sink assembly as claimed in claim 10, wherein the first locking portion defines a slot and an opening communicated with the slot and the second locking portion defines a positioning groove therein, the mounting elements respectively extending through the slot and the positioning groove.

12. The heat sink assembly as claimed in claim 11, wherein the clip further comprises a connecting portion movably embedded in the positioning groove and connecting the clamping portion and the second locking portion together.

13. An electronic assembly, comprising:
a circuit board having a heat generating electronic component mounted thereon;
a heat sink mounted on the heat generating electronic component;
two bolts extending through the heat sink and the circuit board, each bolt having a head engaging with the heat sink, a bead at a bottom thereof and a narrow neck between the head and the bead, the neck having a diameter smaller than that of the bead; and
a clip having a middle pressing portion abutting against a bottom of the circuit board, first and second locking portions extending from two ends of the pressing portion, respectively, a clamping portion being linearly movably and rotatable mounted on the second locking portion, wherein the bead of one of the bolts engages with the first locking portion, and the clamping portion is tightly sandwiched between the bead of the other of the bolts and the second locking portion.

14. The electronic assembly as claimed in claim 13, wherein the clip has a spring portion extending from an end of the second locking portion distant from the pressing portion, the spring portion engaging with the bottom of the circuit board.

15. The electronic assembly as claimed in claim 13, wherein the clamping portion has a cutout receiving the narrow neck of the other of the bolts.

16. The electronic assembly as claimed in claim 15, wherein the clamping portion has a handle.

17. The electronic assembly as claimed in claim 13, wherein the first locking portion has a slot receiving the neck of the one of the bolts and the second locking portion has a groove through which the bead of the other of the bolts extends, the groove being longer than the slot.

18. The electronic assembly as claimed in claim 17, wherein the first locking portion has an opening in communication with the slot, the opening having a diameter larger than a width of the slot.

* * * * *